(12) United States Patent
Slater, Jr. et al.

(10) Patent No.: US 8,643,195 B2
(45) Date of Patent: Feb. 4, 2014

(54) NICKEL TIN BONDING SYSTEM FOR SEMICONDUCTOR WAFERS AND DEVICES

(75) Inventors: David B. Slater, Jr., Durham, NC (US); John A. Edmond, Cary, NC (US); Hua-Shuang Kong, Cary, NC (US)

(73) Assignee: Cree, Inc., Durham, NC (US)

( * ) Notice: Subject to any disclaimer, the term of this patent is extended or adjusted under 35 U.S.C. 154(b) by 1109 days.

(21) Appl. No.: 11/428,158

(22) Filed: Jun. 30, 2006

(65) Prior Publication Data

US 2008/0003777 A1 Jan. 3, 2008

(51) Int. Cl.
H01L 29/40 (2006.01)

(52) U.S. Cl.
USPC .......................................... 257/779; 438/458

(58) Field of Classification Search
USPC ............................ 438/455, 458; 257/678, 779
See application file for complete search history.

(56) References Cited

U.S. PATENT DOCUMENTS

| | | | |
|---|---|---|---|
| 3,648,357 A | 3/1972 | Green, Jr. | |
| 4,418,857 A | 12/1983 | Ainslie et al. | |
| 5,197,654 A | 3/1993 | Katz et al. | |
| 5,234,153 A | 8/1993 | Bacon et al. | |
| 6,250,541 B1 * | 6/2001 | Shangguan et al. | 228/208 |
| 6,335,263 B1 | 1/2002 | Cheung et al. | |
| 6,527,881 B2 | 3/2003 | Kanematsu et al. | |
| 6,744,142 B2 | 6/2004 | Liu et al. | |
| 6,930,389 B2 | 8/2005 | Huang | |
| 7,023,089 B1 | 4/2006 | Lu | |
| 2001/0004534 A1 * | 6/2001 | Carter-Coman et al. | 438/29 |
| 2002/0030198 A1 | 3/2002 | Coman et al. | |
| 2002/0045330 A1 | 4/2002 | Angst et al. | |
| 2002/0068373 A1 * | 6/2002 | Lo et al. | 438/33 |
| 2004/0201029 A1 | 10/2004 | Yamane et al. | |
| 2004/0232439 A1 | 11/2004 | Gibb et al. | |
| 2005/0072835 A1 * | 4/2005 | Choi et al. | 228/180.22 |
| 2006/0049411 A1 | 3/2006 | Nakamura et al. | |
| 2006/0060872 A1 | 3/2006 | Edmond et al. | |
| 2006/0060874 A1 | 3/2006 | Edmond et al. | |
| 2006/0060877 A1 | 3/2006 | Edmond et al. | |
| 2006/0060879 A1 | 3/2006 | Edmond | |
| 2006/0061974 A1 * | 3/2006 | Soga et al. | 361/743 |
| 2006/0128118 A1 * | 6/2006 | Nagahama et al. | 438/458 |
| 2006/0163590 A1 | 7/2006 | Erchak et al. | |
| 2006/0189098 A1 | 8/2006 | Edmond | |

(Continued)

FOREIGN PATENT DOCUMENTS

| | | |
|---|---|---|
| CN | 1476050 A | 2/2004 |
| GB | 234648 A | 6/1925 |

(Continued)

OTHER PUBLICATIONS

International Search Report of foreign counterpart application No. PCT/US2008/072855; mailing date Dec. 3, 2008; 3 pages.

(Continued)

*Primary Examiner* — Bradley K Smith
(74) *Attorney, Agent, or Firm* — Myers Bigel Sibley & Sajovec

(57) ABSTRACT

A semiconductor wafer, substrate, and bonding structure is disclosed that includes a device wafer that includes, for example, a plurality of light emitting diodes, a contact metal layer (or layers) on one side of the device wafer opposite the light emitting diodes, and a bonding metal system on the contact metal layer that predominates by weight in nickel and tin.

36 Claims, 5 Drawing Sheets

(56) References Cited

U.S. PATENT DOCUMENTS

| | | | |
|---|---|---|---|
| 2006/0214274 A1* | 9/2006 | Shimokawa et al. | ......... 257/678 |
| 2007/0141806 A1 | 6/2007 | Uemura et al. | |
| 2008/0003777 A1 | 1/2008 | Slater et al. | |

FOREIGN PATENT DOCUMENTS

| | | |
|---|---|---|
| JP | 2006-140186 | 6/2006 |
| TW | 563262 B | 11/2003 |
| TW | I257714 B | 7/2006 |
| TW | I285969 B | 8/2007 |

OTHER PUBLICATIONS

Lee, et al, "Study of Ni as a barrier metal in AuSn soldering application for laser chip/submount assembly," J. Appl. Phys. vol. 72 No. 8, Oct. 15, 1992, pp. 3808-3815.

Labie et al, "Solid state diffusion in Cu-SN and Ni-Sn diffusion couples with flip-chip scale dimensions," Intermetallics 15, Sep. 26, 2006, pp. 396-403.

Correspondence dated Jul. 8, 2010 from Japanese associate forwarding office action Japanese Patent Application No. 2007-171846, 3 pages.

Neumann et al., "The Ternary System Au-Ni-Sn", 1996 Journal of Solid State Chemistry 123, p. 203-207.

Hsu et al., "Phase equiibria of the Sn-Ag-Ni ternary system and interfacial reactions at the Sn-Ag/Ni joints", 2004 Acta Materialia 52, p. 2541-2547.

Search Report corresponding to ROC(Taiwan) Patent Application No. 096123546.

First Office Action from State Intellectual Property Office of The People's Republic of China Corresponding to Chinese Application No. or Patent No. 201010271760.8; Date of Notification: Nov. 16, 2011; 4 pages.

Decision Issued by Taiwanese Patent Office Corresponding to Taiwan Application No. or Patent No. 096123546; Date of Decision: Aug. 21, 2012; 6 pages (w/ English translation 4 pages).

Taiwanese Office Action With Search Report Corresponding to Taiwanese Patent Application No. 097131759; Issuance Date: Nov. 13, 2012; English Translation, 5 Pages.

* cited by examiner

Fig. 3
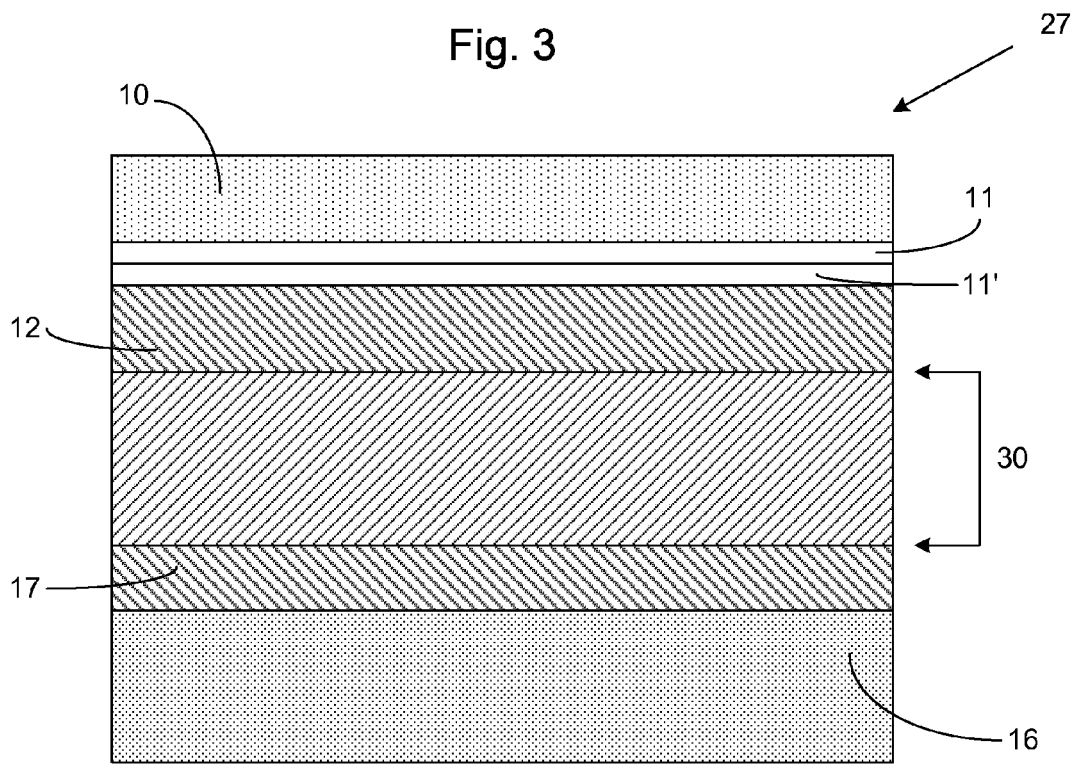
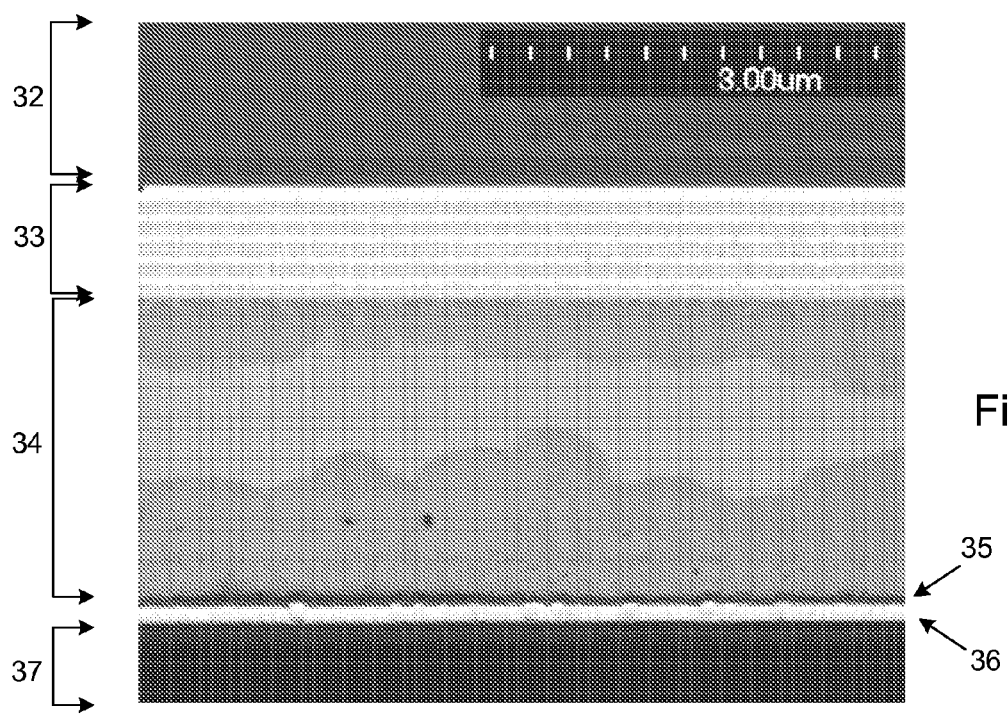
Fig. 4

NICKEL TIN BONDING SYSTEM FOR SEMICONDUCTOR WAFERS AND DEVICES

BACKGROUND

The present invention relates to the structure and composition of metal bonding systems used to attach substrate wafers carrying light emitting diodes (LEDs) to other substrate wafers during LED manufacture.

Light emitting diodes (LEDs) are a class of photonic semiconductor devices that convert an applied voltage into light by encouraging electron-hole recombination events in an appropriate semiconductor material. In turn, some or all of the energy released in the recombination event produces a photon.

A typical LED includes p-type and n-type epitaxial layers ("epilayers") that form a p-n junction through which current injection occurs to produce the recombination events. These epilayers are typically grown on a substrate of the same or a different semiconductor. Epilayers can be produced with relatively high crystal quality and thus enhance the quality and operation of the resulting devices. The substrate portion of the device may not require the same level of quality, or in some cases, substrates formed of the same material as one or more of the epilayers are not readily available (or available at all).

Because of their wide bandgap and direct transition characteristics, the Group III nitride materials are favored for shorter wavelength light emitting diodes; i.e., those that emit in the blue, violet, and ultraviolet portions of the electromagnetic spectrum. The Group III nitride materials can, either in conjunction with diodes of other colors or with phosphors, produce white light. At the same time, Group III nitride substrate crystals of an appropriate size and quality are difficult or impossible to obtain. As a result, LEDs based on the Group III nitride material system typically include Group III nitride epilayers on sapphire or silicon carbide (SiC) substrates.

For a number of reasons, when the epitaxial layers of light-emitting semiconductor materials are formed (typically by chemical vapor deposition ("CVD") growth) on a substrate, the resulting precursor structure can be in some cases added to an additional substrate. The second substrate may be other than a semiconductor or if it is a semiconductor, it is not necessarily present for semiconducting purposes. For example, in commonly assigned and co-pending U.S. Patent Application Publication Number 20060060877, a second substrate is used for mounting and fabrication purposes and to form a portion of a final LED structure. No. 20060060877 is incorporated entirely herein by reference. As set forth therein and elsewhere, the manufacture of certain types of LEDs includes one or more steps to reduce the thickness of the original substrate (e.g., because the original substrate is thicker in order to make the initial manufacturing steps easier). Related background is set forth in commonly assigned U.S. Patent Application Publications Nos. 20060049411, 20060060872, 20060060874, and 20060060879, and the contents of each of these is likewise incorporated entirely herein by reference.

In other structures, light emitting diodes are mounted to second substrates in order to reverse (flip) their normal orientation. Stated differently, in a typical orientation, the substrate is mounted to a lead frame and the epitaxial layers form the emitting face of the LED. In a flip chip orientation, however, the epitaxial layers are mounted towards the lead frame and the substrate provides the light emitting surface of the LED. Various steps in the process of manufacturing such flip chip diodes can require that the LED-carrying substrate wafer be joined to another substrate wafer either temporarily or permanently. In some flip-chip embodiments, the LED-carrying substrate wafer is removed from the epitaxial layers after the epitaxial layers are mounted to the temporary or permanent substrate wafer.

The conventional manner of joining the LED-carrying substrate wafer to another substrate wafer includes the use of various metal layers in a manner either identical or analogous to soldering or brazing when permanent bonding is desired. In many circumstances, a layer of titanium is formed or deposited onto the respective surfaces to be joined, and then additional layers of bonding metals are added to form a bonding metal structure on each of the first and second substrates (sometimes referred to as the donor and acceptor substrates).

For numerous reasons, gold (Au) has historically been a predominant element in these bonding metal layers. Because it resists oxidation and other chemical reactions (which makes it, of course, historically valuable for jewelry and related items), gold also is attractive for its corrosion resistance; i.e., avoiding undesired reaction with its surroundings. It's ability to form relatively low melting point alloys or compounds (with respect to pure gold), makes it ideal for soldering purposes.

Nevertheless, the expense of gold, even the very small amounts used in individual semiconductor devices, becomes significant when multiplied over the millions of individual light emitting diodes that the market now demands.

As another factor, soldering wafers to one another requires some application of heat. Thus, a soldering step used to join an LED substrate wafer to a second substrate wafer will heat the LEDs to some extent. As is well understood by those of ordinary skill in this art, whenever the temperature of the light emitting semiconductor epitaxial layers is raised, the probability is correspondingly raised that defects will be generated in the epitaxial layers. Typically, gold-tin based soldering (bonding, brazing) systems require temperatures above about 300° C. Although epitaxial layers of, for example, Group III nitride materials, can theoretically withstand such temperatures, in reality these temperatures significantly increase the probability that the bonding step will generate noticeable defects.

As yet an additional factor, when individual LEDs are separated from a wafer and mounted on a lead frame (e.g., to form a lamp), they are typically mounted on the lead frame with another soldering step. If the LED already contains a solder bond, the existing solder bond should desirably remain unaffected by the temperatures required to solder the wafer-bonded chip to the lead frame. Thus, the temperature at which the LED can be soldered to the lead frame will be limited by the temperature that the substrate-substrate bond can withstand without melting. Stated differently, the thermal characteristics of the substrate-substrate bonding metallurgy may unfavorably limit the type of solder that can be used to join an individual LED to an individual lead frame.

Accordingly, a need exists for reducing the amount of gold in light emitting diodes, but without compromising the quality of the resulting diodes which, like other semiconductor devices, are characterized by long life and high reliability. A corresponding need exists for substrate bonding metal systems, the use of which avoids or minimizes generating defects in the epitaxial layers, and yet which remain stable when individual LED die are soldered to lead frames and when lead frames are soldered to an assembly.

SUMMARY

In one aspect the invention is a light emitting diode wafer, substrate, and bonding structure that includes a device wafer that includes a plurality of light emitting diodes, a contact metal layer (or layers) on one side of the device wafer opposite the light emitting diodes, and a bonding metal system on the contact metal layer that predominates by weight in nickel and tin.

In another aspect the invention is a wafer structure comprising a device wafer that includes a plurality of LEDs, a substrate wafer bonded to the LED device wafer with a metal bonding system, and with the metal bonding system comprising nickel and tin as the predominating elements by weight.

In yet another aspect, the invention is a method of bonding LED wafers and substrate wafers to one another comprising bonding an LED wafer to a substrate wafer with a metal bonding system that is predominantly nickel and tin by weight.

In yet another aspect, the invention is a light emitting diode comprising an active portion, a substrate portion, and a bonding metal system between the active portion and the substrate portion; the bonding metal system being predominantly nickel and tin by weight.

The foregoing and other objects and advantages of the invention and the manner in which the same are accomplished will become clearer based on the following detailed description taken in conjunction with the accompanying drawings.

BRIEF DESCRIPTION OF THE DRAWINGS

FIG. 3 is a cross sectional schematic diagram of a bonded wafer structure according to the present invention.

FIG. 4 is a scanning electron microscope photograph of a bonding system and adjacent structure according to the present invention.

DETAILED DESCRIPTION

Figure 1:
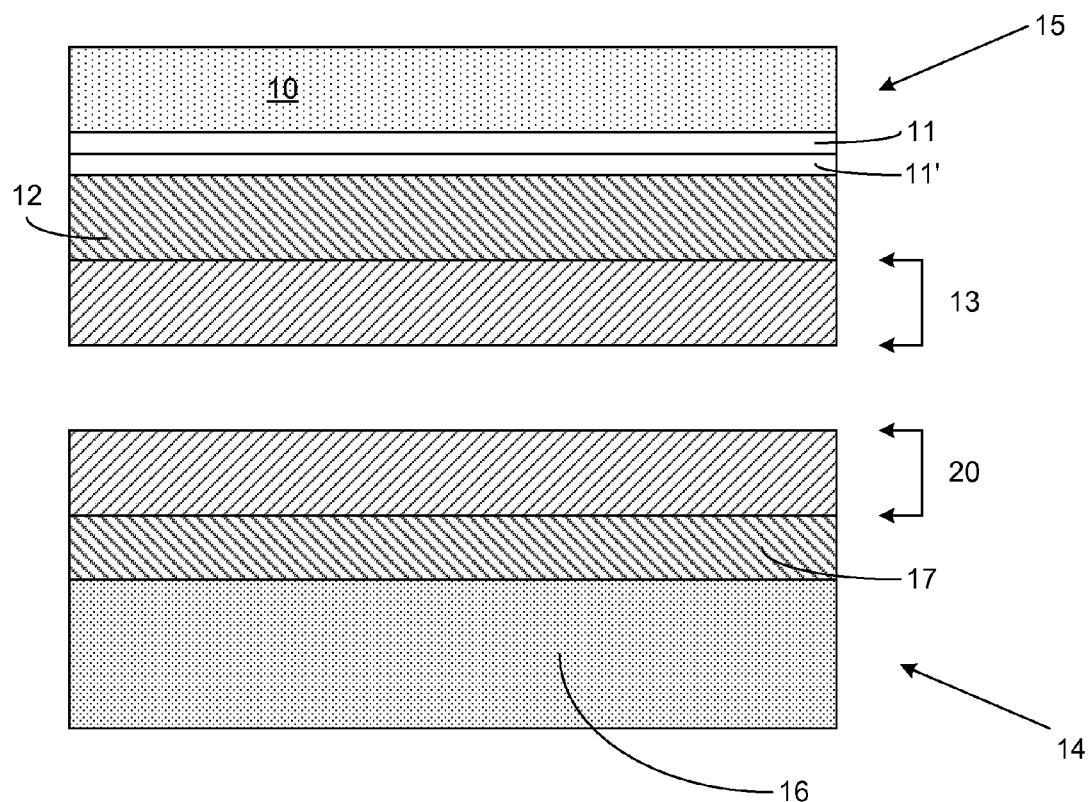
FIG. 1 is a cross sectional schematic view of a device wafer and a substrate wafer before being joined according to the invention.

In a broad sense, the invention is a method of bonding semiconductor structures to one another, and the description herein of bonding light emitting diode-containing wafers to substrate wafers is an exemplary application of the invention.

In this broadest sense, the invention can include heating a three layer structure (e.g., nickel-tin-nickel) that includes a middle layer of lower melting point metal (e.g. Sn at 232° C.) between two outer metal layers, each of which outer layers has a melting point above the melting point of the middle layer (e.g., Ni at 1455° C.). The three layer structure includes a relative amount of the middle layer metal (Sn) that is greater than the amount that would be consumed by reacting with either outer layer (of Ni) alone during the heating step, but less than the amount that would provide a functional reaction excess over both outer layers. The heating step is carried out at a temperature between the melting point of the middle layer (Sn, 232° C.) and the lower of the melting points (Ni, 1455° C.) of the outer layers until the middle layer reacts substantially completely with the outer layers.

In another broad context, the invention is a method of bonding semiconductor wafers to one another. In this aspect, the method includes the step of heating a two-layer metal structure between two semiconductor wafers. The two layers include adjacent first and second metal layers (e.g., Sn and Ni) with the first metal layer (Sn) having a melting point lower than the second metal layer (Ni). The metal structure has a relative amount of the first layer metal (Sn) that is greater than the amount that would be consumed by reacting with the second layer (Ni) alone during the heating step, but less than the amount that would provide a functional excess of the first metal (Sn) between the two bonded wafers. The heating step is carried out at a temperature between the melting point of the first (Sn) and second (Ni) layers until the first layer (Sn) reacts substantially completely with the second layer (Ni) and with the surface of the adjacent wafer.

As used herein, a "functional reaction excess" refers to an amount of the lower melting point metal that would negatively affect the function of the bond at temperatures approaching or near the lower melting point. Stated in terms of a middle layer of tin (melting point 232° C.) between two layers of nickel (melting point 1455° C.), if a sufficient amount of unreacted tin were to remain after the heating step, then temperatures of just above 232° C. would melt the tin and defeat the purpose of the entire bonding system. Thus, the relative amounts of the metals are chosen so that although small amounts or regions of the lower melting point metal may remain after reaction, they are insufficient to cause the bond to melt at such undesired low temperatures. This would compromise the mechanical integrity of the bonded structure.

Stated in perhaps exaggerated terms using tin and nickel, if following the heating step a portion of the bonding structure remains substantially entirely tin, then the weakest point of the bonding system is simply a tin layer that will melt at tin's melting point. In such a situation, no net benefit will have been accomplished because a tin layer will be both the starting material and the resulting product, giving no net improvement before and after the heating step.

In particular, in the two layer context, the metal structure is initially positioned on the first wafer with a higher melting point (second) metal positioned between the first wafer and the lower melting point (first) metal layer; i.e., the lower melting point layer is "exposed." As a result, when the lower melting point metal melts, it will be in contact with both the second metal and the second wafer. Stated differently, in the Ni—Sn embodiment the lower melting point metal (Sn) must be in a position to wet both the higher temperature metal (Ni) and the second substrate.

Stated in a negative context, if two substrates are brought into contact with the higher melting point metal (Ni) forming the border between the substrates, no wetting and accordingly no bonding-would take place at the recited temperatures.

The heating step is also typically carried out at a temperature that is less than the melting point of the alloys or compounds that form between the metal layers during the heating step. The phrase "during the heating step," is used to confirm that the relative amounts described in the claims and the manner in which they react is understood in terms of the heating step and not in terms of some unlimited amount of time over which the metals may happen to be in contact.

Although the nickel-tin system is both exemplary and useful for the purposes of the invention (particularly including higher throughput and lower cost than conventional gold-tin systems), the lower temperature metal may also be selected to be other than tin, with bismuth, or combinations thereof, forming a useful alternative. Similarly, although nickel is exemplary, the higher melting point temperature metal can be selected from the group consisting of nickel, cobalt, iron, copper and combinations thereof.

Because the metals form compounds, the heating step can typically be carried out at temperatures at or above about 250° C. With respect to the metals standing alone, the upper limit for the heating step is defined by the melting points of the alloys formed by the metals in the bonding system. Such a theoretical upper boundary is typically relatively high; i.e., the melting points of Ni-Sn compounds that range from about 30-70 weight percent tin are all above 750° C.). Thus, the practical upper limit is usually selected based upon the thermal characteristics of the substrates or of the devices on the substrates. These are generally much lower; e.g. as set forth herein, Group III nitride layers are preferably maintained below about 300° C. during other process steps.

In one embodiment, the invention is a light emitting diode wafer, substrate and bonding structure in which the bonding structure predominates in nickel (Ni) and tin (Sn). In FIG. 1, a device wafer broadly designated at 15 includes a substrate material 10 and plurality of device layers represented by the epitaxial layers 11 and 11'. When the device wafer 15 includes light emitting diodes or diode precursors, the epitaxial layers 11 and 11' are typically formed of semiconductor materials that will emit light under the influence of an applied current (as described in the Background). Two layers 11 and 11' are illustrated because they schematically represent the p-type and n-type layers that are most fundamental to a junction diode structure. Those familiar with this art will recognize, of course, that the active portion in a light emitting diode can include a plurality of layers for various purposes including heterojunctions, superlattice structures and multiple quantum wells.

It will likewise be understood that FIG. 1 (and FIGS. 2 and 3) are schematic cross-sectional diagrams and are sized for illustration purposes rather than proportional and literal accuracy. As will be described later herein, some of the illustrated layers are in reality several orders of magnitude different from one another in thickness, and attempting to illustrate such literally would decrease, rather than increase the clarity of this description.

As set forth in the Background, it will be understood that an epitaxial layer-carrying or LED-carrying substrate wafer can be bonded to another substrate for a variety of purposes and in a variety of respective orientations with respect to the location of epitaxial layers or devices. Thus, although FIG. 1 illustrates the respective substrates 14 and 15 as being joined in a certain position with respect to the light emitting layers 11, 11'. FIG. 1 is exemplary rather than limiting of the manner in which the invention can be used. It should be understood that as used herein the term substrate wafer can include the epitaxial layers on the growth substrate, the epitaxial layers on a different temporary or permanent substrate or the epitaxial layers themselves (with the substrate removed) bonded to the other substrate.

The invention is not limited to particular types of substrate materials or materials that form the light emitting diodes, but because of their importance in the marketplace, much of the description will be in terms of light emitting diodes and corresponding wafer structures that are formed in the Group III nitride material system, typically on silicon carbide (SiC) or sapphire ($Al_2O_3$) substrates. The nature and operation of individual LED devices are well understood in the art and will not be repeated in detail herein. Appropriate references include SZE, PHYSICS OF SEMICONDUCTOR DEVICES, 2d Edition (1981); SCHUBERT, LIGHT-EMITTING DIODES, Cambridge University Press (2003) and, ZETTERLING, PROCESS TECHNOLOGY FOR SILICON CARBIDE DEVICES, Electronic Materials Information Service (2002).

The term Group III nitride is used herein in its usual sense; i.e., to refer to binary, ternary, and quaternary compounds of Group III elements-most commonly gallium (Ga), aluminum (Al), and indium (In)—with nitrogen (N) in a relationship in which the atomic fraction of all of the Group III nitrides and the nitrogen are 1:1. The selection of particular Group III nitride compositions for any one or more of the layers of the light emitting diodes is well understood in the art and thus need not be described in detail with respect to the present invention.

Returning to FIG. 1, the substrate wafer 15 also typically includes a contact metal layer or plurality of layers that together are designated at 12. The contact layers 12 are selected for their electrical characteristics with respect to the semiconductor material within which they are in contact. In the majority of light emitting diode structures, the metal contacts 12 will be selected on the basis of their ohmic character with respect to either the p-type or n-type material on which they are deposited (substrate or epitaxial layer). Once an appropriate ohmic contact is made between the metal and the semiconductor, other metals can be included in the contact layer 12 for purposes such as corrosion resistance, lower-cost, or ease of manufacture.

A bonding metal system indicated by the bracketed arrows 13 is on the contact metal layer 12. In the invention, the bonding metal system predominates by weight in nickel (Ni) and tin (Sn). In particular, the bonding metal system will comprise more than 50 percent by weight of nickel and tin, in some cases more than 75 percent nickel and time, and in some embodiments more than 85 percent by weight of nickel and tin.

Because one objective is to reduce gold, in some embodiments gold is entirely eliminated or used in minimal amounts. Expressed with respect to the gold, the metal bonding system 13 contains gold in an amount less than 50 percent by weight and in some embodiments less than 20 percent by weight.

Figure 6:
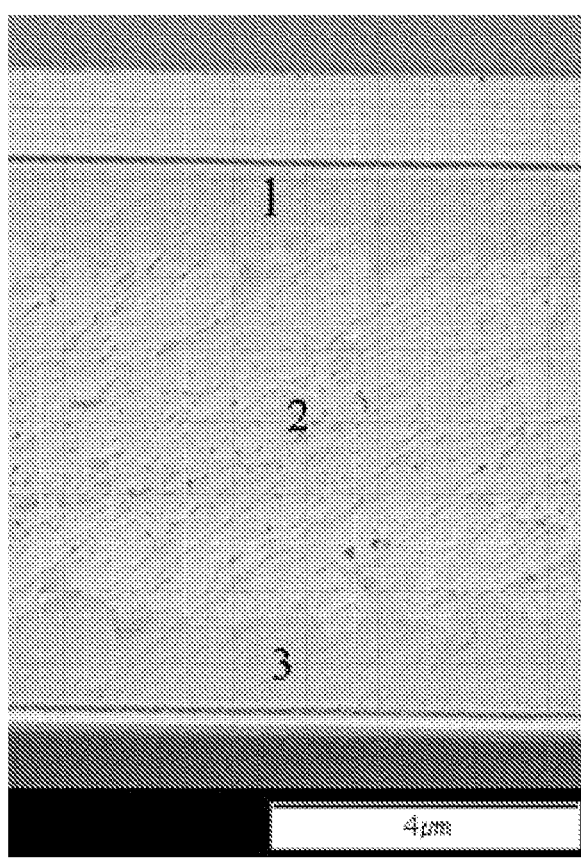
FIG. 6 is a scanning electron micrograph of a conventional metal bonding system.

Those familiar with this art will recognize that in many conventional bonding systems, gold is the element overwhelming present by weight, sometimes about 80 percent by weight (e.g., FIG. 6). Accordingly, the invention represents a significant reduction in the amount of gold present.

FIG. 1 also illustrates a substrate wafer 14 to be joined to the device wafer 15. Although FIG. 1 shows the wafer structures slightly separated from one another, it will be understood that they are brought into contact to be joined as described herein with respect to the method aspects of the invention. The substrate wafer 14 includes the substrate material 16 and a contact metal system 17 similar or identical to the metal contact layers 12. The substrate wafer 14 includes its own plurality of bonding metal layers illustrated together by the bracketed arrows 20 on the contact metal layers 17. As in the case of the device wafer 15, the bonding metal system 20 on the substrate wafer 14 predominates by weight in nickel and tin and potentially in the same proportions as those just described with respect to the device wafer 15.

Figure 2:
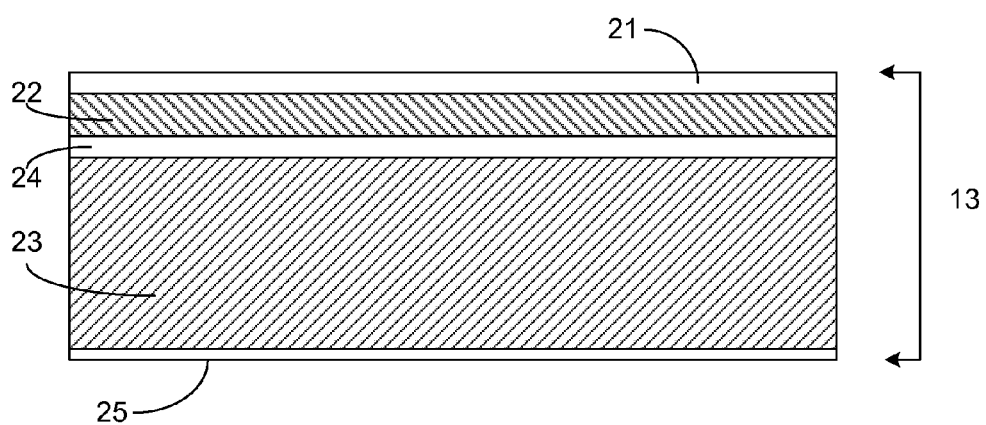
FIG. 2 is a cross sectional schematic diagram of the bonding metal system of the present invention.

FIG. 2 shows the bonding metal system 13 in greater detail. Although FIG. 2 illustrates proportional thickness differences between and among the individual layers, these are representative rather than literal in scale.

For the sake of comparison, the bonding metal system 13 is oriented the same in FIG. 2 as in FIG. 1. With that as context, the bonding metal system 13 can include an adhesion layer 21, for example of a layer of titanium (Ti) or alloys thereof, in direct contact with the metal contact layers 12. Titanium is typically included for its adhesive properties in such metal bonding systems. Other materials can be used depending on the embodiment. A layer of nickel 22 is on the titanium layer 21, and in some embodiments, the structure is completed with the layer of tin 23 on the nickel layer 22. FIG. 2 illustrates, however, that in other embodiments a layer of gold 24 can be included to enhance the metallurgy of the structure, but in amounts much smaller than conventionally used. Similarly a relatively thin layer of gold flash 25 can be added to the bonding metal system 13 for purposes of enhancing the bonding connection but while still greatly minimizing the amount of gold used in comparison to conventional structures. It should be understood that depending on the embodiment more or fewer layers may be included using different materials as would be understood by one of skill in the art.

Perhaps more importantly, in the invention the thickness of the tin layer 23 is sufficient to provide an amount of tin that will react with one of the adjacent nickel layers to provide the desired Ni—Sn composition while still providing additional tin to wet and react with the other adjacent metal (usually nickel) layer.

As examples, the titanium layers are typically about a thousand angstroms (1000 Å) or less, the nickel layers are about 2000 Å, the optional gold layer is about 1000 Å, and the gold flash layer is about 150-300 Å. The tin, however, is about two microns (2 μm); i.e., about 10 times as thick as any of the other layers.

The bonding metal layers 13 and 20 on the respective wafers 14 and 15 can be identical to (symmetric), or different from (asymmetric), one another. As an example, of an asymmetric combination, the device wafer 15 could include the bonding structure 13 as just described while the substrate wafer 14 could include a simpler combination of the gold flash, the nickel, and the titanium adhesion layer. It will be understood that in an asymmetric embodiment, either of the respective sets of layers can be initially present on either substrate.

In another embodiment, the metal layers 13 on the device wafer 15 can eliminate the gold layer 24 and the bonding metal layers 20 on the substrate wafer 14 can include the gold flash, the nickel and the titanium adhesion layer.

FIG. 3 accordingly represents a schematic illustration of a combination of bonded substrates broadly designated at 27. Where appropriate, similar elements carry similar reference numerals as FIGS. 1 and 2. It will be noted however, that the device wafer 15 and the substrate wafer 14 are no longer identified as individual structures because the bonding metals have combined to form a finished bonding metal structure indicated by the bracketed arrows 30 rather than the individual bonding structures 13 and 20 illustrated in FIG. 1. The contact layers 12 and 17 are the same, however, as is the substrate wafer material 16, the device substrate material 10 and the light emitting layers schematically indicated at 11 and 11'.

The combined bonding metal system 30 comprises nickel and tin as the predominating elements by weight, and because it is formed of the bonding metal layers 13 and 20, these will be in proportions similar to those just described in the respective separate bonding layers 13 and 20 before they are joined.

In this regard, when percentages of metals and alloys are described in the specification, they can fall into at least two categories. The first is the overall percentage of a given metal or alloy in the bonding system. For example, if one gram of nickel and two grams of tin are applied to a substrate, the weight percentage will always be 33 percent nickel and 67 percent tin regardless of the alloys that they form or the number of discrete layers or regions that they produce after heating.

Within the bonding system, however, and consistent with the overall weight percentages, discrete layer-like portions can be identified and can have compositions that differ from the overall composition.

Accordingly, in the embodiments illustrated in FIG. 4, the weight percentages for the entire bonding system are 20.5 percent nickel, 67.5 percent tin, and 12 percent gold (based upon the thickness of the original layers and the density of each metal). The percentages in the different discrete regions visible in FIG. 4, however, may be individually different from the overall percentages.

FIG. 4 is an SEM (scanning electron microscope) photograph taken in cross-section of a bonded structure according to the present invention. In general, the device substrate wafer and epitaxial layers are indicated by the bracketed arrow 32. The metal contact layers are indicated by the bracketed arrows 33, the bonding metal system is designated by the bracketed arrows 34, and a titanium adhesion layer is the dark layer indicated by the arrow 35. A metal contact layer is likewise indicated by the arrow 36 and the substrate wafer material is indicated by the bracketed arrows 37.

A 150 Å titanium layer is present between portions 33 and 34 of FIG. 4, but is too thin to appear in the photograph. The thicker portion of titanium 35 is about 1000 Å thick and thus is visible in FIG. 4.

Figure 5:
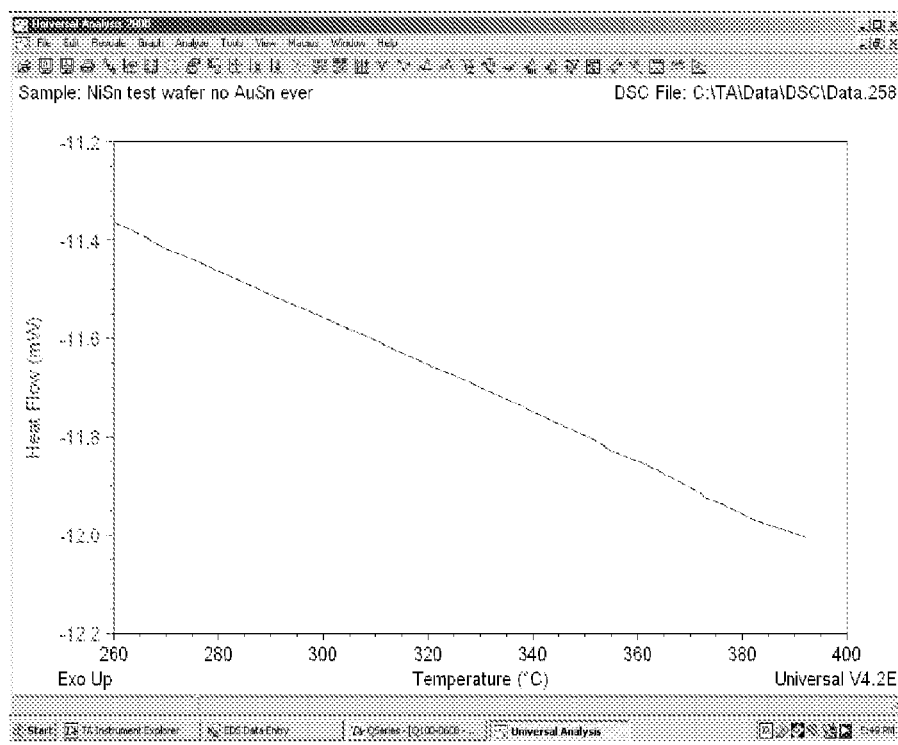
FIG. 5 is a differential scanning calorimetry plot of the bonding metal system of the invention.

FIG. 5 is a plot of DSC (differential scanning calorimetry) carried out on the wafer photographed in FIG. 4. The generally smooth line up to above 350° C.; i.e. without any melting point breaks or other phase changes, indicates the predominantly nickel-tin character of the resulting bond in this temperature range. This in turn means that the metal bonding system will remain solid when individual light emitting diodes are soldered to individual lead frames at any of the temperatures plotted in FIG. 5.

FIG. 6 is a comparative SEM photograph on an essentially identical scale of a more conventional gold-tin bonding system. The overall composition is 3.9% Ni, 19.1% Sn, and 77.0% Au (based upon the thicknesses of the originally-deposited layers and the density of each metal). Approximately three discrete areas can be identified (labeled as 1, 2 and 3)

In another embodiment, the invention is a method of bonding LED wafers and substrate wafers to one another comprising bonding an LED wafer to a substrate wafer with a metal bonding system that is predominantly nickel and tin by weight.

As set forth with respect to the structural aspects of the invention, the use of nickel and tin rather than gold as predominating elements permits the wafers to be bonded together at temperatures below 300° C., thus reducing the potential for higher temperatures that can adversely affect the quality (and thus the performance) of the epitaxial layers. In many cases, the predominantly nickel and tin bonding system permits the wafers to be joined at a temperature no greater than about 275° C. Furthermore, the bonding can be carried out relatively quickly; i.e., in about ten minutes.

With respect to the Group III nitride material system, the ability to bond the substrate and device wafers to one another at temperatures below 300° C. offers particular advantages because 300° C. centigrade represents a temperature at which thermally-generated defects, stress, wafer distortion, and similar problems begin to appear in more significant proportions.

The wafers to be joined are brought into intimate contact and under pressure. In typical embodiments the applied pressure is between about 200 and 400 pounds per square inch (PSI). As an example, approximately 4000 Newtons (N) of force are brought to bear on a two inch (50 millimeter) diameter device wafer and the corresponding support wafer. From a functional standpoint, the wafers are brought together under sufficient pressure to provide the desired bonds, while avoiding excessive pressures that would adversely affect the remainder of the structure (including the devices) or the bond itself. In general (although not necessarily universally), thicker wafers, or wafers that are less flat (a relative term), may require higher pressures than otherwise identical thinner or flatter wafers.

The method further includes the steps of separating the bonded wafer into individual light emitting diodes and thereafter soldering the individual light emitting diodes to individual lead frames, typically to form displays or lamps depending upon the needs and desires of the manufacturer, customer, or end-user.

The predominantly nickel-tin bonding system provides a different, but complementary, thermal advantage at this step because the bond will remain solid at temperatures above 300° C., thus favorably allowing higher soldering temperatures as compared to a conventional 80:20 Au:Sn bonding system. As a result, and when compared to predominantly gold bonding systems, the predominantly nickel-tin bonding system offers both the advantageous capability of bonding wafers together at lower temperatures as well as the advantageous capability of attaching individual light emitting diodes to lead frames at higher soldering temperatures, lower cost, and efficient throughput.

Accordingly, the method can include soldering the individual light emitting diodes to individual lead frames at temperatures above 300° C. and in some cases at temperatures of at least about 350° C.

As in the structural context, the method typically comprises bonding an LED wafer that includes contact metals to a substrate wafer that likewise includes contact metals with the nickel-tin metal bonding system between the respective contact metals on the respective substrates.

The method incorporates nickel and tin, and optionally small amounts of gold, in proportions the same as those discussed with respect to the structural aspects of the invention. Thus, the method typically comprises bonding the wafers with the metal bonding system that is more than 50 percent by weight, and often more than 85 percent by weight, of nickel and tin.

Expressed alternatively, and in terms of reduced amounts of gold, the method comprises bonding the wafers with a metal bonding system in which gold is present in an amount less than 36 percent by weight, and typically less than 15 percent by weight.

Figure 7:
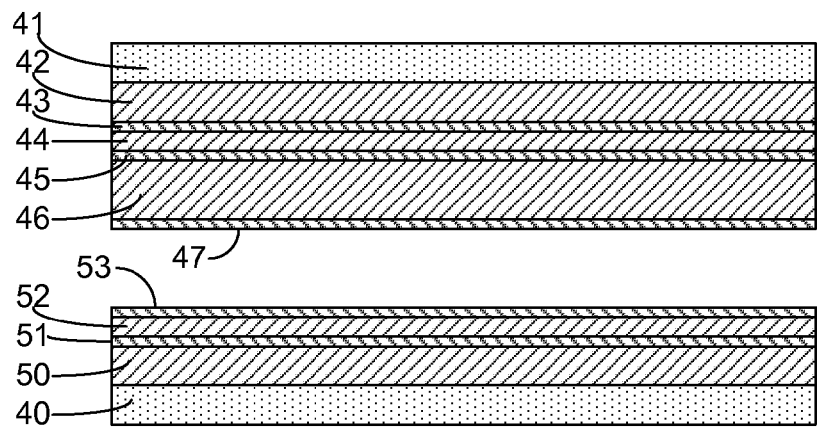
FIGS. 7, 8 and 9 are cross-sectional schematic diagrams of additional embodiments of the metal bonding system of the invention.
Figure 8:
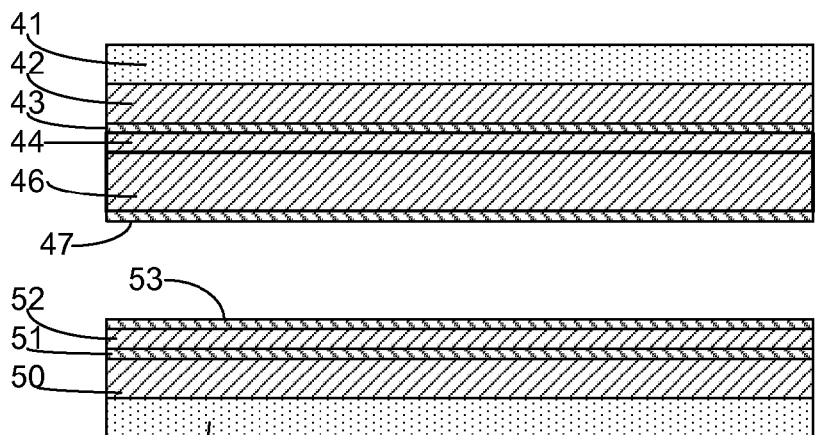
Figure 9:
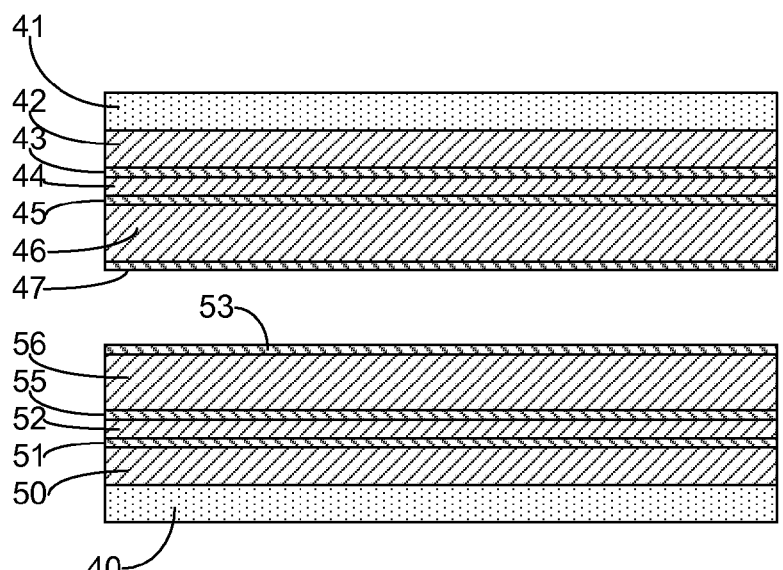

FIGS. 7, 8 and 9 schematically illustrate additional combinations for the metal bonding system. FIG. 7 illustrates an asymmetric bonding system with an extra layer, such as a gold layer,), and is referred to as such because the bonding metals applied to the substrate wafer 40 differ from those applied to the device wafer 41. For the sake of clarity, the epitaxial layers 11 and 11' are not shown separately in FIGS. 7-9 but will be understood to be present as part of the device wafer 41.

In this embodiment, the device wafer 41 carries the contact metal layer (or layers) 42, the titanium adhesion layer 43, a nickel layer 44, a thin layer of gold 45, a proportionally thicker layer of tin 46, and the gold flash layer 47. In an exemplary embodiment, the titanium layer 43 is about 1000 Å thick, the nickel layer 44 is about 2000 Å thick, the gold layer 45 is about 1000 Å thick, and the tin layer 46 is much thicker, usually about two microns thick. The gold flash layer 47 is the thinnest at about 300 Å and is provided to reduce oxidation but without significantly increasing (or adding) the amount of gold in the overall structure.

The substrate wafer 40 carries its own contact metal layer (or layers) 50, the adhesion layer 51, a nickel layer 52, and a flash layer 53, for example of gold.

In typical embodiments the adhesion layer 51 is about a thousand Å thick, the nickel layer 52 is about 3000 Å thick, and the flash layer is only about 50 Å thick.

FIG. 8 is an asymmetric bonding system similar to FIG. 7, but without any gold other than the 300 Å and 50 Å flash layers; i.e., the gold layer 45 from FIG. 7 is absent from the structure of FIG. 8. Similar layers carry similar reference numerals as in FIG. 7. Accordingly, FIG. 8 illustrates the device wafer 41 and its contact metal layers 42. The titanium layer 43 is on the contact layer 42 and the nickel 44 is on the titanium layer 43. The tin layer 46 is, however, directly adjacent the nickel layer 44 and without any gold in between. The gold flash layer 47 completes the device wafer portion of the bonding system.

In FIG. 8 the substrate wafer 40 carries the same layers as in the embodiment illustrated in FIG. 7, namely, the substrate wafer 40, the contact metal layer 50, the titanium layer 51, the nickel layer 52, and the gold flash 53. These all have thicknesses similar (although not necessarily identical) to those described with respect to FIG. 7.

Similarly, the layers on the device wafer 41 in FIG. 8 have thicknesses similar to those described with respect to FIG. 7.

As noted earlier, in asymmetric arrangements such as are illustrated in FIGS. 7 and 8, the sets of layers are not specifically limited to either wafer. For example, the invention includes embodiments in which the layers illustrated as 51-53 are on the device substrate 41 and the layers labeled as 43-47 are on the substrate wafer 40.

FIG. 9 is a schematic diagram of a symmetric bonding system; i.e. one in which tin is used on both of the respective wafers before they are joined together. Once again, and where appropriate, like elements carry the same reference numerals in FIG. 9 as they did in FIGS. 7 and 8.

Accordingly, the device wafer 41 in FIG. 9 carries the same elements as did the device wafer 41 in FIG. 8. This includes the contact metal layers 42, the titanium layer 43, the nickel layer 44, the gold layer 45, the relatively thick tin layer 46, and the gold flash 47. These are generally the same thicknesses as described with respect to FIG. 7.

The substrate wafer 40 in FIG. 9 carries a mirror image set of layers to the device wafer 41. Accordingly, these include the contact metal layer 50, and the titanium layer 51. The nickel layer 52 is likewise present, but because FIG. 9 illustrates a symmetric bonding system the substrate wafer 40 also includes the optional gold layer 55 on the nickel layer 52 and the substrate wafer 40 likewise carries the proportionally thick tin layer 56. The gold flash layer 53 again completes the substrate wafer structure.

The relative thicknesses of the layers illustrated with respect to the substrate wafer 40 in FIG. 9 are typically (although not necessarily) the same as described with respect to the layers on the device wafer 41. For example, the thicknesses of the nickel layers 44 and 52 can be 4000 angstroms and the flash can be 30 angstroms. The various thicknesses are exemplary and other thicknesses are possible. Conceptually, the metal layers are applied in relative thicknesses that provide the desired percentages of metal in the layers and in the bonding system. Thus, as well understood by persons of skill in this art, obtaining a proportion of two or more given metals by weight can be accomplished by applying a thicknesses of each metal that, when combined with the area covered by each metal and each metal's density (gold is 19.3 grams per cubic centimeter (g/cm$^{-3}$), tin is 7.3 g/cm$^{-3}$, and nickel is 8.9 g/cm$^{-3}$), provides the desired proportion with respect to the other metals.

Figure 10:
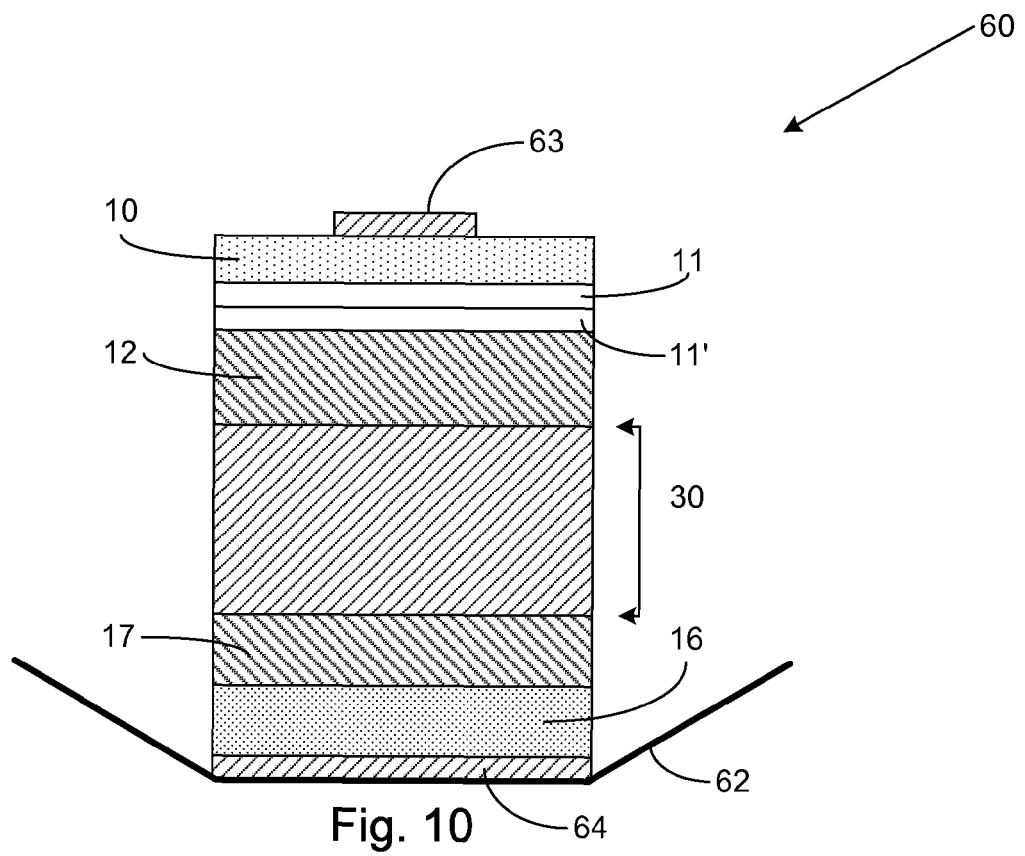
FIGS. 10 and 11 are cross-sectional schematic diagrams of light emitting diodes according to the present invention.
Figure 11:
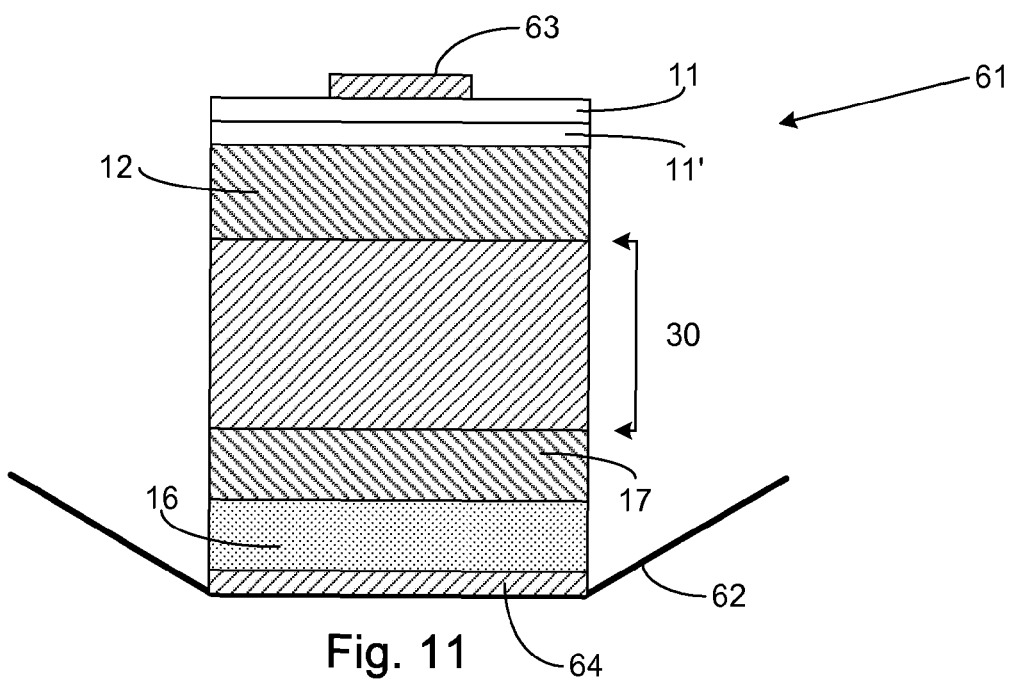

FIGS. 10 and 11 are schematic cross-sectional diagrams of light emitting diodes that incorporate the bonding system of the present invention. FIGS. 10 and 11 are best understood in relation to FIG. 3 which illustrates many of the same elements in the form of the bonded wafers.

FIGS. 10 and 11 are very similar with the exception being that FIG. 10 illustrates a light emitting diode 60 in which the substrate material 10 remains as part of the structure and forms the light-emitting face of the diode. In contrast, FIG. 11 illustrates a light emitting diode 61 in which the original substrate material has been entirely removed and in which the epitaxial layers 11 and 11' form the light emitting face.

Accordingly, FIG. 10 includes the substrate material 10 which, if allowed to remain as illustrated, is preferably as transparent as possible in order to maximize the effective visible output of the LED 60. The epitaxial layers 11 and 11' make up the light emitting active portion of the LED 60. As described earlier with respect to the wafer embodiments, two layers are shown for clarity and simplicity of illustration. In reality the light emitting structures can include more layers or more complex structures such as multiple quantum wells, superlattice structures and conductive or insulating buffer layers.

The LED 60 likewise includes the contact metal layers 12 that were originally part of the device wafer 15 (FIG. 1) and the contact metal layers 17 that were originally part of the substrate wafer 14. The bonding metal system is again designated by the bracketed arrows 30 and includes the predominantly nickel and tin system described earlier. The composition of the bonding metal system 30 likewise can include the same respective proportions of nickel, tin, and in some cases gold as previously described. Similarly, the embodiments described with respect to FIGS. 7, 8 and 9 can form the bonding metal system 30.

The diode 60 is mounted on a lead frame 62 and includes a first respective ohmic contact 63 adjacent the epitaxial layers 11, 11' and a second ohmic contact 64 adjacent the substrate material 16 and forming an electrical connection to the lead frame 62.

Those familiar with this art will recognize that other elements are typically included when an LED such as 60 or 61 is added to a lead frame. These can include solders, adhesives and in many cases a polymer lens that encapsulates the diode 60 or 61 on the lead frame.

The light emitting diode 61 in FIG. 11 is identical to the LED 60 with the exception that the substrate material 10 of LED 60 has been entirely removed. Accordingly, the ohmic contact 63 is made to the epitaxial layers 11, 11', but otherwise the remainder of the elements are structurally and compositionally the same and carry the same reference numerals. The composition of the ohmic contact 63 may be different depending upon the material with which it is intended to form the ohmic contact, but the various combinations of metals and semiconductors that demonstrate ohmic characteristics are well known in this art, need not be described in detail, and can be selected by those of skill in this art without undue experimentation.

In all of the disclosed embodiments of wafers and diodes, it will be understood that various additional elements may be present that have not been described in detail herein as would be understood by one of skill in the art. For example, the titanium adhesion layers (i.e., elements 43 and 51 in FIGS. 7-9) and the gold flash layers are typically used in such structures, but different materials, less or additional layers using these or other materials are possible. Similarly, because the structures can differ somewhat, terms such as "on" or "above" can refer in context to the relative positions of materials with respect to one another rather than to direct physical contact between such layers. Thus, in FIGS. 10 and 11, for example, the ohmic contacts are said to be "on" various portions of the diodes and it will be understood that if some other intervening layer was included, it would still fall within the description and claims herein. For example, the invention has been described relative to a particular "flip-chip" orientation; however, the bonding system and method described herein can be used with a variety of orientations. Additionally, the bonding system and method could be used in a system where the epitaxial layers are bonded directly to a lead frame or mounting structure.

The invention has been described primarily in terms of light emitting diode wafers, but it will be understood that it can also be used in conjunction with other bonds including, but not limited to, die attachment or bonding of discrete LEDs other discrete devices.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A light emitting diode bonding structure comprising:
   a device wafer having epitaxial layers;
   a contact metal layer on one side of said device wafer opposite said epitaxial layers; and
   a bonding metal system on said contact metal layer that predominates by weight in metals selected from the group consisting of nickel and tin and that comprises first and second layers containing respective first and second metals selected from the group consisting of nickel and tin and configured to form a compound containing the first and second metals responsive to heating of the bonding metal system,
   wherein the bonding metal system comprises:
   more than 50 percent by weight of nickel and tin;
   an adhesion layer on said contact metal layer;
   a layer of nickel on said adhesion layer, and
   a layer of tin directly on said nickel layer.

2. A structure according to claim 1 wherein the bonding metal system comprises more than 50 percent by weight of nickel and tin.

3. A structure according to claim 1 wherein the bonding metal system comprises more than 85 percent by weight of nickel and tin.

4. A structure according to claim 1 wherein the bonding metal system comprises gold in an amount less than 50 percent by weight.

5. A structure according to claim 4 wherein the bonding metal system comprises gold in an amount less than 15 percent by weight.

6. A structure according to claim 1 further comprising a thin flash layer of gold on said tin layer.

7. A light emitting diode and bonding structure according to claim 1 further comprising
   a substrate wafer in contact with said device wafer, said substrate wafer comprising
   a substrate material;
   a contact metal layer on said substrate material;

a plurality of substrate bonding metal layers on said substrate contact metal layers and in contact with said bonding metal layers on said device wafer; said substrate bonding metal layers including predominantly nickel and tin.

8. A light emitting diode and bonding structure according to claim 7 comprising a plurality of metal contact layers on said substrate wafer.

9. A light emitting diode and bonding structure according to claim 1 comprising a plurality of metal contact layers on said device wafer.

10. A structure according to claim 1, wherein the first and second layers respectively comprise nickel and tin layers configured to form a nickel-tin compound responsive to heating the bonding metal to a temperature less than 300° C.

11. A structure according to claim 1, wherein the first and second layers respectively comprise nickel and tin layers configured to form a nickel-tin compound responsive to heating the bonding metal to a temperature less than 275° C.

12. A structure according to claim 1 wherein the first and second metals are selected from the group consisting of bismuth, cobalt, iron, copper, nickel and tin.

13. A wafer structure comprising:
a device wafer that includes a plurality of LEDs;
a substrate wafer bonded to said LED device wafer with a metal bonding system;
said metal bonding system comprising nickel and tin as the predominating elements by weight,
wherein the metal bonding system includes gold in an amount less than 15 percent by weight of the metal bonding system and,
wherein the metal bonding system is formed by heating at a temperature below 300° C.

14. A wafer structure according to claim 13 wherein said metal bonding system includes more than 50 percent by weight of nickel and tin.

15. A wafer structure according to claim 13 wherein said metal bonding system includes more than 85 percent by weight of nickel and tin.

16. A method of bonding LED and substrate wafers to one another comprising:
bonding an LED wafer to a substrate wafer with a metal bonding system comprising thermally compounded metals that are predominantly nickel and tin by weight; and
forming the thermally compounded metals by heating at a temperature below 300° C.,
wherein the thermally compounded metals comprise gold in an amount less than 15 percent by weight.

17. A method according to claim 16 comprising forming the thermally compounded metals at a temperature no greater than 275° C.

18. A method according to claim 16 comprising compressing the wafers together while forming the thermally compounded metals.

19. A method according to claim 16 further comprising:
separating a structure comprising the bonded wafers into individual light emitting diodes; and
thereafter soldering the individual light emitting diodes to individual lead frames.

20. A method according to claim 19 comprising soldering the individual light emitting diodes to the lead frames at temperatures above 300° C.

21. A method according to claim 19 comprising soldering the individual light emitting diodes to the lead frames at temperatures of at least 350° C.

22. A method according to claim 16 comprising bonding an LED wafer that includes contact metals to a substrate wafer that includes contact metals with the metal bonding system between the respective contact metals on the respective substrates.

23. A method according to claim 16 wherein the thermally compounded metals are more than 50 percent by weight of nickel and tin.

24. A method according to claim 16 wherein the thermally compounded metals are more than 85 percent by weight of nickel and tin.

25. A light emitting diode comprising:
an active portion;
a mounting portion; and
a bonding metal system between said active portion and said mounting portion; said bonding metal system comprising compounded metals that are predominantly nickel and tin by weight,
wherein said compounded metals comprise gold in an amount less than 15 percent by weight of the metal bonding system, and
wherein the metal bonding system is formed by heating at a temperature below 300° C.

26. A light emitting diode according to claim 25 wherein compounded metals comprise more than 50 percent by weight of nickel and tin.

27. A light emitting diode according to claim 25 wherein said compounded metals comprise more than 85 percent by weight of nickel and tin.

28. A light emitting diode according to claim 25 wherein said active portion includes at least one epitaxial layer of group three nitride material.

29. A light emitting diode according to claim 25 comprising respective ohmic contacts to said active portion and to said substrate portion.

30. A light emitting diode according to claim 25 wherein said active portion forms the emitting surface of said diode.

31. A light emitting diode according to claim 25 wherein a device substrate forms the light emitting surface of said diode.

32. A light emitting diode according to claim 31 wherein said device substrate is selected from the group consisting of silicon carbide and sapphire.

33. A method of bonding LED and substrate wafers, the method comprising:
heating while contacting a tin layer on the LED wafer with a nickel layer on the substrate wafer to form a compound metal bonding region predominantly comprising nickel and tin by weight.

34. A method according to claim 33, wherein the tin layer is provided on a nickel layer on the LED wafer.

35. A method according to claim 34, wherein a gold layer is provided between the nickel and tin layers on the LED wafer.

36. A method according to claim 34,
wherein a flash gold layer is provided on the tin layer on the LED wafer,
wherein a flash gold layer is provided on the nickel layer on the substrate wafer, and
wherein the flash gold layers do not exceed a thickness of about 300 Å.

* * * * *